United States Patent
Asakawa et al.

(10) Patent No.: US 11,542,590 B2
(45) Date of Patent: *Jan. 3, 2023

(54) STRAIN GAUGE

(71) Applicant: MINEBEA MITSUMI Inc., Nagano (JP)

(72) Inventors: Toshiaki Asakawa, Shizuoka (JP); Yuta Aizawa, Shizuoka (JP); Shinya Toda, Shizuoka (JP); Shintaro Takata, Nagano (JP); Shinichi Niwa, Shizuoka (JP)

(73) Assignee: MINEBEA MITSUMI Inc., Nagano (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/650,560

(22) PCT Filed: Sep. 26, 2018

(86) PCT No.: PCT/JP2018/035706
§ 371 (c)(1),
(2) Date: Mar. 25, 2020

(87) PCT Pub. No.: WO2019/065740
PCT Pub. Date: Apr. 4, 2019

(65) Prior Publication Data
US 2020/0325571 A1    Oct. 15, 2020

(30) Foreign Application Priority Data
Sep. 29, 2017 (JP) .............. JP2017-191820

(51) Int. Cl.
C23C 14/20 (2006.01)
C23C 14/00 (2006.01)
(Continued)

(52) U.S. Cl.
CPC .......... C23C 14/20 (2013.01); C23C 14/0063 (2013.01); C23C 14/0652 (2013.01);
(Continued)

(58) Field of Classification Search
CPC ....... G01B 7/16; C23C 14/20; C23C 14/0063; C23C 14/0652; C23C 14/08; C23C 14/10; G01L 1/22; G01L 1/2281
See application file for complete search history.

(56) References Cited

U.S. PATENT DOCUMENTS 3,867,231 A   2/1975 Casey
4,658,233 A   4/1987 Uchida et al.
(Continued)

FOREIGN PATENT DOCUMENTS

CN   105755438   7/2016
CN   106768524   5/2017
(Continued)

OTHER PUBLICATIONS

International Search Report for PCT/JP2018/035706 dated Dec. 11, 2018.
(Continued)

Primary Examiner — Randy W Gibson
Assistant Examiner — John M Royston
(74) Attorney, Agent, or Firm — IPUSA, PLLC

(57) ABSTRACT

A strain gauge includes a flexible substrate; a functional layer formed of a metal, an alloy, or a metal compound, on one surface of the substrate; and a resistor formed of material including at least one from among chromium and nickel, on one surface of the functional layer.

10 Claims, 4 Drawing Sheets

(51) Int. Cl.
    *C23C 14/06*     (2006.01)
    *C23C 14/08*     (2006.01)
    *C23C 14/10*     (2006.01)
    *G01B 7/16*     (2006.01)
    *G01L 1/22*     (2006.01)

(52) U.S. Cl.
    CPC ............. *C23C 14/08* (2013.01); *C23C 14/10* (2013.01); *G01B 7/16* (2013.01); *G01L 1/22* (2013.01); *G01L 1/2281* (2013.01)

(56) References Cited

U.S. PATENT DOCUMENTS

| | | | |
|---|---|---|---|
| 4,737,757 A | 4/1988 | Senda et al. | |
| 4,758,816 A | 7/1988 | Blessing et al. | |
| 4,786,887 A | 11/1988 | Bringmann et al. | |
| 4,876,893 A | 10/1989 | Kato et al. | |
| 4,937,550 A | 6/1990 | Tawada et al. | |
| 5,154,247 A | 10/1992 | Nishimura et al. | |
| 5,328,551 A | 7/1994 | Kovacich | |
| 5,349,746 A | 9/1994 | Gruenwald et al. | |
| 5,455,453 A | 10/1995 | Harada et al. | |
| 5,622,901 A * | 4/1997 | Fukada ................. | G01L 1/2262 438/10 |
| 5,914,168 A | 6/1999 | Wakamatsu et al. | |
| 6,512,510 B1 * | 1/2003 | Maeda ................. | G06F 3/0213 345/160 |
| 8,232,026 B2 | 7/2012 | Kumar et al. | |
| 9,256,119 B2 | 2/2016 | Nam et al. | |
| 9,306,207 B2 | 4/2016 | Woo et al. | |
| 11,087,905 B2 * | 8/2021 | Asakawa ............... | H01C 17/12 |
| 2003/0016116 A1 | 1/2003 | Blaha | |
| 2004/0056321 A1 | 3/2004 | Parsons | |
| 2004/0140868 A1 | 7/2004 | Takeuchi et al. | |
| 2005/0160837 A1 | 7/2005 | Tellenbach et al. | |
| 2005/0188769 A1 | 9/2005 | Moelkner et al. | |
| 2005/0276990 A1 | 12/2005 | Kohara et al. | |
| 2008/0253085 A1 | 10/2008 | Soffer | |
| 2011/0109701 A1 | 5/2011 | Ohashi | |
| 2012/0190166 A1 | 7/2012 | Okuda | |
| 2013/0082970 A1 | 4/2013 | Frey et al. | |
| 2013/0181808 A1 | 7/2013 | Chen et al. | |
| 2013/0300254 A1 | 11/2013 | Fujii et al. | |
| 2015/0188769 A1 | 7/2015 | Gu | |
| 2015/0276517 A1 | 10/2015 | Ashida et al. | |
| 2015/0296607 A1 | 10/2015 | Yang et al. | |
| 2015/0348900 A1 | 12/2015 | Nishimura et al. | |
| 2016/0114584 A1 | 4/2016 | Abbot, Jr. et al. | |
| 2016/0282205 A1 * | 9/2016 | Huo ....................... | G01L 9/0054 |
| 2016/0372606 A1 | 12/2016 | Ito et al. | |
| 2017/0123548 A1 | 5/2017 | Shih et al. | |
| 2017/0261388 A1 | 9/2017 | Ma et al. | |
| 2017/0336900 A1 | 11/2017 | Lee et al. | |
| 2017/0363486 A1 | 12/2017 | Okulov | |
| 2017/0370796 A1 * | 12/2017 | Dusing ................... | G01L 23/18 |
| 2018/0217016 A1 | 8/2018 | Inamori et al. | |
| 2018/0275001 A1 | 9/2018 | Tokuda | |
| 2020/0076016 A1 | 3/2020 | Riemer et al. | |
| 2020/0271533 A1 | 8/2020 | Yuguchi et al. | |
| 2020/0292294 A1 | 9/2020 | Misaizu et al. | |
| 2020/0333199 A1 | 10/2020 | Asakawa et al. | |
| 2021/0003378 A1 | 1/2021 | Asakawa et al. | |
| 2021/0018382 A1 | 1/2021 | Misaizu et al. | |
| 2021/0033476 A1 | 2/2021 | Toda et al. | |
| 2021/0063259 A1 | 3/2021 | Misaizu et al. | |
| 2021/0247210 A1 | 8/2021 | Asakawa et al. | |
| 2021/0270683 A1 | 9/2021 | Kitamura et al. | |

FOREIGN PATENT DOCUMENTS

| | | |
|---|---|---|
| CN | 111417830 | 7/2020 |
| EP | 0171467 | 2/1986 |
| EP | 725392 | 8/1996 |
| EP | 1197737 | 4/2002 |
| EP | 1530708 | 5/2005 |
| EP | 3690385 | 8/2020 |
| JP | S49-042780 | 4/1974 |
| JP | S58-097607 | 6/1983 |
| JP | S58-169150 | 10/1983 |
| JP | S61-176803 | 8/1986 |
| JP | S63-245962 | 10/1988 |
| JP | H01-202601 | 8/1989 |
| JP | H02-189981 | 7/1990 |
| JP | H03-191802 | 8/1991 |
| JP | H04-038402 | 2/1992 |
| JP | H04-095738 | 3/1992 |
| JP | H05-080070 | 3/1993 |
| JP | H05-145142 | 6/1993 |
| JP | H06-176903 | 6/1994 |
| JP | 06300649 A * | 10/1994 |
| JP | H06-300649 | 10/1994 |
| JP | H07-71906 | 3/1995 |
| JP | H07-113697 | 5/1995 |
| JP | H07-306002 | 11/1995 |
| JP | H08-102163 | 4/1996 |
| JP | H08-304200 | 11/1996 |
| JP | H09-016941 | 1/1997 |
| JP | H09-197435 | 7/1997 |
| JP | H10-270201 | 10/1998 |
| JP | 2002-221453 | 8/2002 |
| JP | 2003-097906 | 4/2003 |
| JP | 2003-324258 | 11/2003 |
| JP | 2004-072715 | 3/2004 |
| JP | 2006-170707 | 6/2006 |
| JP | 2007-173544 | 7/2007 |
| JP | 2010-070850 | 4/2010 |
| JP | 2012-151338 | 8/2012 |
| JP | 2013-117422 | 6/2013 |
| JP | 2013-217763 | 10/2013 |
| JP | 2014-074661 | 4/2014 |
| JP | 2015-031633 | 2/2015 |
| JP | 2016-017882 | 2/2016 |
| JP | 2016-074934 | 5/2016 |
| JP | 2016-136605 | 7/2016 |
| JP | 2016-225598 | 12/2016 |
| JP | 2017-067764 | 4/2017 |
| JP | 2017-129417 | 7/2017 |
| JP | 2017-210572 | 11/2017 |
| JP | 2017-210573 | 11/2017 |
| JP | 2019-066312 | 4/2019 |
| JP | 2019-066313 | 4/2019 |
| JP | 2019-066454 | 4/2019 |
| WO | 2004/074800 | 9/2004 |
| WO | 2017/094368 | 6/2017 |

OTHER PUBLICATIONS

Japanese Office Action for 2017-191820 dated Mar. 17, 2020.
Extended European Search Report dated May 10, 2021 (EP Patent Application No. 18862478.7).
International Search Report for PCT/JP2018/035939 dated Dec. 18, 2018.
International Search Report for PCT/JP2018/040357 dated Jan. 15, 2019.
Office Action dated Dec. 7, 2021 with respect to the corresponding Japanese patent application No. 2020-098850.
Office Action dated Jan. 6, 2022 with respect to the corresponding Chinese patent application No. 201880076750.3.
Office Action dated Jan. 13, 2022 with respect to the related Chinese patent application No. 201880084755.0.
International Search Report for PCT/JP2018/035727 dated Dec. 18, 2018.
Yujiro Sakurauchi, "Handbook for utilizing industrial materials", Jan. 25, 1989, pp. 114-149, 166-169, 174-175, 226-235.
Mars J R: "New Strain Gages Are Similar To Thin Film Resistors, Permit Analysys of Multilayer Boards", Insulation, Circuits, Lake Publishing Co., Libertyville, IL, US, vol. 19, No. 11, Oct. 1, 1973 (Oct. 1, 1973), pp. 35-37, XP009047141, ISSN: 0020-4544 "the whole document".
Office Action dated May 28, 2021 with respect to the related Chinese patent application No. 201880076801.2.

(56) References Cited

OTHER PUBLICATIONS

Extended European Search Report dated Jun. 4, 2021 with respect to the related European patent application No. 18860610.7.
Office Action dated Dec. 7, 2021 with respect to the related Japanese patent application No. 2017-191821.
Office Action dated Jan. 6, 2022 with respect to the related Chinese patent application No. 201880076443.5.
Office Action dated Jan. 12, 2022 with respect to the related Chinese patent application No. 201880076801.2.
Extended European Search Report dated May 10, 2021 (EP Patent Application No. 18860865.7).
American Technical Publishers Ltd.: "ASM Ready Reference: Thermal Properties of Metals", Apr. 27, 2021 (Apr. 27, 2021), pp. 1-9, XP055799057, Retrieved from the Internet: URL:https://www.owlnet.rice.edu/~msci301/ThermalExpansion.pdf [retrieved on Apr. 27, 2021].
International Search Report for PCT/JP2018/035713 dated Dec. 11, 2018.
Office Action dated Oct. 8, 2020 (U.S. Appl. No. 16/758,506).
Extended European Search Report dated Jun. 17, 2021 with respect to the related European Patent Application Mo 18863695.5.
Office Action dated Jun. 1, 2021 with respect to the related Chinese Patent Application No. 201880084755.0.
Office Action dated Dec. 7, 2021 with respect to the related Japanese patent application No. 2017-210571.
Office Action dated Sep. 27, 2021 with respect to the related Chinese patent application No. 201880089676.9.
International Search Report for PCT/JP2018/046854 dated Feb. 12, 2019.
Office Action dated Jan. 25, 2022 with respect to the related Japanese patent application No. 2017-246871.
Office Action dated Jan. 28, 2022 with respect to the related U.S. Appl. No. 16/955,329.
International Search Report for PCT/JP2019/014528 dated Jun. 25, 2019.
Shintaku, Kazuhiko, "Thin-film manufacturing by a sputtering method and its application", The 1st joint education workshop of National Institute of Technology, Akita College, [online], 2014, [retrieval date Jun. 17, 2019] Internet: URL: http://akita-nct.coop-edu.jp/assets/uploads/2014/12/6c13667c41571e8378dc2994ce1fcbd4.pdf, non-official translation, published on Dec. 9, 2014. With Partial English Translation.
Office Action dated Dec. 27, 2021 with respect to the related U.S. Appl. No. 16/650,553.
Office Action dated Apr. 12, 2022 with respect to the related Japanese patent application No. 2018-052421.
Office Action dated Apr. 12, 2022 with respect to the related Japanese patent application No. 2018-052422.
Office Action dated May 3, 2022 with respect to the related U.S. Appl. No. 16/650,963.
Office Action dated Apr. 29, 2022 with respect to the related Chinese patent application No. 201880089676.9 (With Partial Translation).
Office Action dated May 5, 2022 with respect to the related Chinese patent application No. 201980022374.4 (With Partial Translation).
Office Action dated Sep. 6, 2022 with respect to the related Japanese patent application No. 2017-191821.
Office Action dated Sep. 6, 2022 with respect to the related Japanese patent application No. 2017-210571.
Office Action dated Sep. 6, 2022 with respect to the related Japanese patent application No. 2020-098850.
C. Rebholz et al., "Structure, mechanical and tribological properties of nitrogen-containing chromium coating prepared by reactive magnetron sputtering", Surface and Coatings Technology, vol. 115, Issues 2-3, pp. 222-229, Jul. 18, 1999.
Haruhiro Kobayashi, Nikkan Kogoy Shimbun, Ltd., "Sputter thing film—Fundamentals and Application", 1st Edition, 1st Printing,p. 102-107, Feb. 25, 1993 (With Partial Translation).
Shigeru Ikeda et al., Osaka National Research Institute, AIST, "Improvement of Oxidation Resistivity of Carbon Material by Borosilicate Glass Impregnation", TANSO, 1994, No. 162, 1994, No. 162, p. 84-91, Jun. 28, 2010.
Kyoritsu Shuppan Co., Ltd., "Dictionary of Crystal Growth", 1st Edition, 1st Printing, p. 50-51, Jul. 25, 2001 (With Partial Translation).
Iwanami Shoten, Publishers., "Dictionary of Chemistry", 4th Edition, 7th Printing, p. 364, Jul. 20, 1992 (With Partial Translation).
Office Action dated Oct. 11, 2022 with respect to the related Japanese patent application No. 2017-246871.
Office Action dated Oct. 18, 2022 with respect to the related Japanese patent application No. 2018-052421.
Office Action dated Oct. 18, 2022 with respect to the related Japanese patent application No. 2018-052422.
Office Action dated Nov. 8, 2022 with respect to the related Japanese patent application No. 2018-073438.
Japan Metal Society,"Metal Data Book", 4th Edition, 4th Printing, pp. 132, Jul. 10, 2008 (With Partial Translation).

\* cited by examiner

STRAIN GAUGE

TECHNICAL FIELD

The present invention relates to a strain gauge.

BACKGROUND ART

A strain gauge is known to be attached to a measured object to detect strain on the measured object. The strain gauge includes a resistor for detecting strain, and as a resistor material, for example, material including Cr (chromium) or Ni (nickel) is used. The resistor is formed on a substrate made of, for example, an insulating resin (see, for example, Patent document 1).

CITATION LIST

Patent Document

Patent document 1 Japanese Unexamined Patent Application Publication No. 2016-74934

SUMMARY

However, when a flexible substrate is used, a stable resistor is not easily formed on the substrate, and thus there is a problem in instability of gauge characteristics (a gauge factor, a gauge factor temperature coefficient TCS, and a temperature coefficient of resistance TCR).

In view of the point described above, an object of the present invention is to improve stability of gauge characteristics of a strain gauge including a resistor formed above a flexible substrate.

A strain gauge includes a flexible substrate; a functional layer formed of a metal, an alloy, or a metal compound, on one surface of the substrate; and a resistor formed of material including at least one from among chromium and nickel, on one surface of the functional layer.

Effects of the Invention

According to the disclosed technique, with respect to a strain gauge including a resistor formed above a flexible substrate, stability of gauge characteristics can be improved.

DESCRIPTION OF EMBODIMENTS

One or more embodiments will be hereinafter described with reference to the drawings. In each figure, the same numerals denote the same components; accordingly, duplicative explanations may be omitted.

First Embodiment

Figure 1:
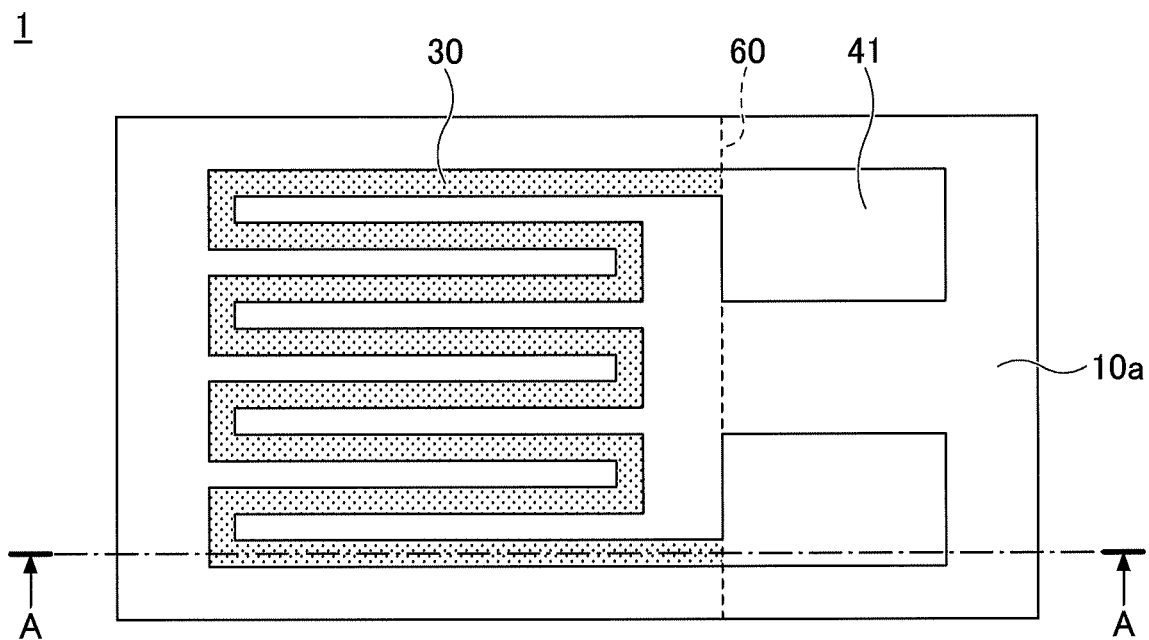
FIG. 1 is a plan view of an example of a strain gauge according to a first embodiment.
Figure 2:
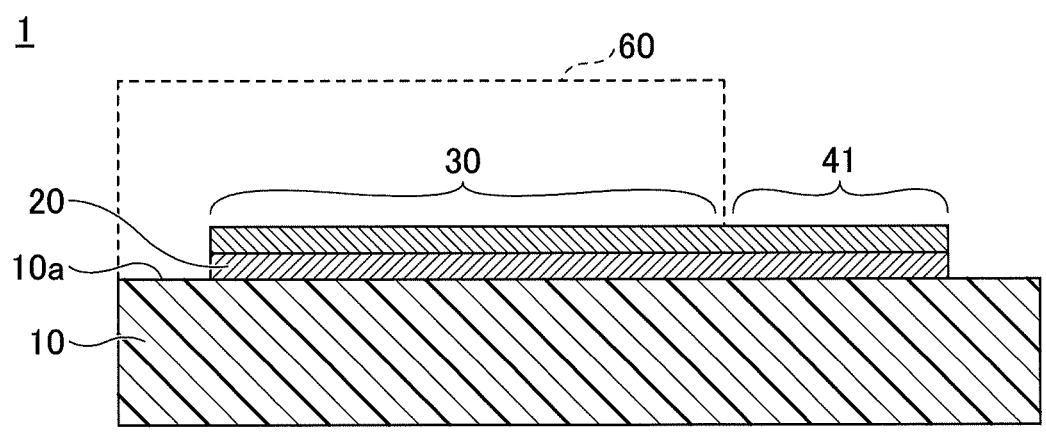
FIG. 2 is a cross-sectional view of an example of the strain gauge according to the first embodiment.

FIG. 1 is a plan view of an example of a strain gauge according to a first embodiment. FIG. 2 is a cross-sectional view of an example of the strain gauge according to the first embodiment, and illustrates a cross section taken along the A-A line in FIG. 1. With reference to FIGS. 1 and 2, the strain gauge 1 includes a substrate 10, a functional layer 20, a resistor 30, and terminal sections 41.

Note that in the present embodiment, for the sake of convenience, with respect to the strain gauge 1, the side of the substrate 10 where the resistor 30 is provided is referred to as an upper side or one side; and the side of the substrate 10 where the resistor 30 is not provided is referred to as a lower side or another side. Further, for each component, the surface on the side where the resistor 30 is provided is referred to as one surface or an upper surface; and the surface on the side where the resistor 30 is not provided is referred to as another surface or a lower surface. However, the strain gauge 1 can be used in a state of being upside down, or be disposed at any angle. Further, a plan view means that an object is viewed from a normal direction of an upper surface 10a of the substrate 10, and a planar shape refers to a shape of an object when viewed from the normal direction of the upper surface 10a of the substrate 10.

The substrate 10 is a member that is a base layer for forming the resistor 30 or the like and is flexible. The thickness of the substrate 10 is not particularly restricted, and can be appropriately selected for any purpose. For example, such a thickness can be approximately between 5 μm and 500 μm. In particular, when the thickness of the substrate 10 is between 5 μm and 200 μm, it is preferable in terms of strain transfer from a flexure element surface that is bonded to a lower surface of the substrate 10 via an adhesive layer or the like; and dimensional stability with respect to environment, and when the thickness is 10 μm or more, it is further preferable in terms of insulation.

The substrate 10 can be formed of an insulating resin film such as a PI (polyimide) resin, an epoxy resin, a PEEK (polyether ether ketone) resin, a PEN (polyethylene naphthalate) resin, a PET (polyethylene terephthalate) resin, a PPS (polyphenylene sulfide) resin, or a polyolefin resin. Note that the film refers to a flexible member having a thickness of about 500 μm or less.

Here, the "formed of an insulating resin film" is not intended to preclude the substrate 10 from containing fillers, impurities, or the like in the insulating resin film. The substrate 10 may be formed of, for example, an insulating resin film containing fillers such as silica or alumina.

The functional layer 20 is formed, as a lower layer of the resistor 30, on the upper surface 10a of the substrate 10. In other words, a planar shape of the functional layer 20 is approximately the same as the planar shape of the resistor 30 illustrated in FIG. 1. The thickness of the functional layer 20 can be approximately between 1 nm and 100 nm, for example.

In the present application, the functional layer refers to a layer that has a function of promoting crystal growth of the resistor 30 that is at least an upper layer. The functional layer 20 preferably further has a function of preventing oxidation of the resistor 30 caused by oxygen and moisture included in the substrate 10, as well as a function of improving adhesion between the substrate 10 and the resistor 30. The functional layer 20 may further have other functions.

The insulating resin film that constitutes the substrate 10 contains oxygen and moisture. In this regard, particularly when the resistor 30 includes Cr (chromium), it is effective for the functional layer 20 to have a function of preventing oxidation of the resistor 30, because Cr forms an autoxidized film.

The material of the functional layer 20 is not particularly restricted as long as it is material having a function of promoting crystal growth of the resistor 30 that is at least an upper layer. Such material can be appropriately selected for any purpose, and includes one or more types of metals selected from a group consisting of, for example, Cr (chromium), Ti (titanium), V (vanadium), Nb (niobium), Ta (tantalum), Ni (nickel), Y (yttrium), Zr (zirconium), Hf (hafnium), Si (silicon), C (carbon), Zn (zinc), Cu (copper), Bi (bismuth), Fe (iron), Mo (molybdenum), W (tungsten), Ru (ruthenium), Rh (rhodium), Re (rhenium), Os (osmium), Ir (iridium), Pt (platinum), Pd (palladium), Ag (silver), Au (gold), Co (cobalt), Mn (manganese), and Al (aluminum); an alloy of any metals from among the group; or a compound of any metal from among the group.

Examples of the above alloy include FeCr, TiAl, FeNi, NiCr, CrCu, and the like. Examples of the above compound include TiN, TaN, $Si_3N_4$, $TiO_2$, $Ta_2O_5$, $SiO_2$, and the like.

The resistor 30 is a thin film formed in a predetermined pattern and on the upper surface of the functional layer 20, and is a sensitive section where resistance varies according to strain. Note that in FIG. 1, for the sake of convenience, the resistor 30 is illustrated in a crepe pattern.

The resistor 30 can be formed of, for example, material including Cr (chromium); material including Ni (nickel); or material including both of Cr and Ni. In other words, the resistor 30 can be formed of material including at least one from among Cr and Ni. An example of the material including Cr includes a Cr composite film. An example of the material including nickel includes Cu—Ni (copper nickel). An example of the material including both of Cr and Ni includes Ni—Cr (nickel chromium).

Here, the Cr composite film is a composite film of Cr, CrN, $Cr_2N$, and the like. The Cr composite film may include incidental impurities such as chromium oxide. A portion of the material that constitutes the functional layer 20 may also be diffused into the Cr composite film. In this case, the material that constitutes the functional layer 20, and nitrogen may form a compound. For example, when the functional layer 20 is formed of Ti, the Cr composite film may include Ti or TiN (titanium nitride).

The thickness of the resistor 30 is not particularly restricted, and can be appropriately selected for any purpose. The thickness can be, for example, approximately between 0.05 μm and 2 μm. In particular, when the thickness of the resistor 30 is 0.1 μm or more, it is preferable in terms of improvement in crystallinity (e.g., crystallinity of α-Cr) of a crystal that constitutes the resistor 30, and when the thickness of the resistor 30 is 1 μm or less, it is further preferable in terms of reduction in cracks of a given film caused by internal stress of the film that constitutes the resistor 30, or reduction in warp in the substrate 10.

With the resistor 30 being formed on the functional layer 20, the resistor 30 can be formed by a stable crystalline phase and thus stability of gauge characteristics (a gauge factor, a gauge factor temperature coefficient TCS, and a temperature coefficient of resistance TCR) can be improved.

For example, when the resistor 30 is the Cr composite film, in a case of providing the functional layer 20, the resistor 30 can be formed with α-Cr (alpha-chromium) as the main component. Because α-Cr has a stable crystalline phase, the stability of the gauge characteristics can be improved.

Here, a main component means that a target substance has 50% by weight or more of total substances that constitute the resistor. When the resistor 30 is the Cr composite film, the resistor 30 preferably includes α-Cr of 80% by weight or more, from the viewpoint of improving the gauge characteristics. Note that α-Cr is Cr having a bcc structure (body-centered cubic structure).

Also, by diffusing a metal (e.g., Ti) that constitutes the functional layer 20 into the Cr composite film, the gauge characteristics can be improved. Specifically, the gauge factor of the strain gauge 1 can be 10 or more, as well as the gauge factor temperature coefficient TCS and temperature coefficient of resistance TCR can be each in the range of from −1000 ppm/° C. to +1000 ppm/° C.

The terminal sections 41 respectively extend from both end portions of the resistor 30 and are each wider than the resistor 30 to be in an approximately rectangular shape, in a plan view. The terminal sections 41 are a pair of electrodes from which a change in a resistance value of the resistor 30 according to strain is output externally, where, for example, a lead wire for an external connection, or the like is joined. For example, the resistor 30 extends zigzagged back and forth from one of the terminal sections 41 to another terminal section 41. The upper surface of each terminal section 41 may be coated with a metal allowing for better solderability than the terminal section 41. Note that for the sake of convenience, the resistor 30 and the terminal sections 41 are expressed by different numerals. However, the resistor and the terminal sections can be integrally formed of the same material, in the same process.

A cover layer 60 (insulating resin layer) may be provided on and above the upper surface 10a of the substrate 10, such that the resistor 30 is coated and the terminal sections 41 are exposed. With the cover layer 60 being provided, mechanical damage, and the like can be prevented from occurring in the resistor 30. Additionally, with the cover layer 60 being provided, the resistor 30 can be protected against moisture, and the like. Note that the cover layer 60 may be provided to cover all portions except for the terminal sections 41.

The cover layer 60 can be formed of an insulating resin such as a PI resin, an epoxy resin, a PEEK resin, a PEN resin, a PET resin, or a PPS resin, a composite resin (e.g., a silicone resin or a polyolefin resin). The cover layer 60 may contain fillers or pigments. The thickness of the cover layer 60 is not particularly restricted, and can be appropriately selected for any purpose. For example, the thickness may be approximately between 2 μm and 30 μm.

Figure 3A:
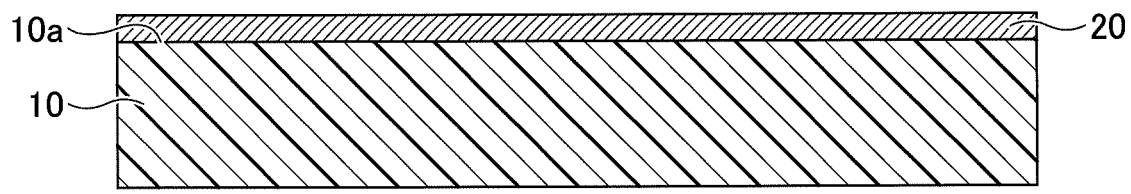
FIG. 3A is a diagram (part 1) illustrating an example of a process of manufacturing the strain gauge according to the first embodiment.
Figure 3B:
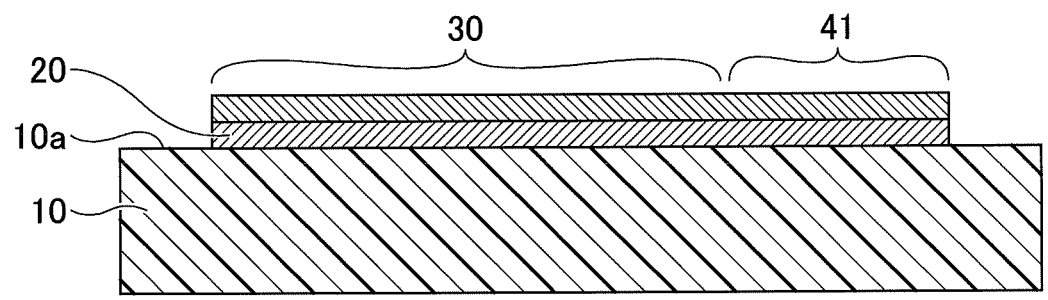
FIG. 3B is a diagram (part 2) illustrating an example of the process of manufacturing the strain gauge according to the first embodiment.

FIGS. 3A and 3B are diagrams illustrating a process of manufacturing the strain gauge according to the first embodiment, and each illustrate a cross section corresponding to FIG. 2. In order to manufacture the strain gauge 1, first, in the process illustrated in FIG. 3A, the substrate 10 is prepared and the functional layer 20 is formed on the upper surface 10a of the substrate 10. The material and thickness for each of the substrate 10 and the functional layer 20 are the same as the material and thickness described above.

The functional layer 20 can be vacuum-deposited by, for example, conventional sputtering in which a raw material capable of forming the functional layer 20 is the target and in which an Ar (argon) gas is supplied to a chamber. By using conventional sputtering, the functional layer 20 is deposited while the upper surface 10a of the substrate 10 is etched with Ar. Thus, a deposited amount of film of the functional layer 20 is minimized and thus an effect of improving adhesion can be obtained.

However, this is an example of a method of depositing the functional layer 20, and the functional layer 20 may be formed by other methods. For example, before depositing the functional layer 20, the upper surface 10a of the substrate 10 is activated by plasma treatment using Ar, etc. or the like to thereby obtain the effect of improving the adhesion; subsequently, the functional layer 20 may be vacuum-deposited by magnetron sputtering.

Next, in the process illustrated in FIG. 3B, the resistor 30 and the terminal sections 41 are formed on the entire upper surface of the functional layer 20, and then the functional layer 20, the resistor 30, and the terminal sections 41 are each patterned in the planar shape as illustrated in FIG. 1, by photolithography. The material and thickness for each of the resistor 30 and the terminal sections 41 are the same as the material and thickness described above. The resistor 30 and the terminal sections 41 can be integrally formed of the same material. The resistor 30 and the terminal sections 41 can be deposited by, for example, magnetron sputtering in which a raw material capable of forming the resistor 30 and the terminal sections 41 is a target. Instead of the magnetron sputtering, the resistor 30 and the terminal sections 41 may be deposited by reactive sputtering, vapor deposition, arc ion plating, pulsed laser deposition, or the like.

A combination of the material of the functional layer 20 and the material of the resistor 30 and the terminal sections 41 is not particularly restricted, and can be appropriately selected for any purpose. For example, Ti is used for the functional layer 20, and a Cr composite film formed with α-Cr (alpha-chromium) as the main component can be deposited as the resistor 30 and the terminal sections 41.

In this case, each of the resistor 30 and the terminal sections 41 can be deposited by, for example, magnetron sputtering in which a raw material capable of forming the Cr composite film is the target and in which an Ar gas is supplied to a chamber. Alternatively, the resistor 30 and the terminal sections 41 may be deposited by reactive sputtering in which pure Cr is the target and in which an appropriate amount of nitrogen gas, as well as an Ar gas, are supplied to a chamber.

In such methods, a growth face of the Cr composite film is defined by the functional layer 20 formed of Ti, and a Cr composite film that is formed with α-Cr as the main component having a stable crystalline structure can be deposited. Also, Ti that constitutes the functional layer 20 is diffused into the Cr composite film, so that the gauge characteristics are improved. For example, the gauge factor of the strain gauge 1 can be 10 or more, as well as the gauge factor temperature coefficient TCS and temperature coefficient of resistance TCR can be each in the range of from −1000 ppm/° C. to +1000 ppm/° C.

Note that when the resistor 30 is a Cr composite film, the functional layer 20 formed of Ti includes all functions being a function of promoting crystal growth of the resistor 30; a function of preventing oxidation of the resistor 30 caused by oxygen or moisture contained in the substrate 10; and a function of improving adhesion between the substrate 10 and the resistor 30. Instead of Ti, when the functional layer 20 is formed of Ta, Si, Al, or Fe, the functional layer also includes the same functions.

After the process illustrated in FIG. 3B, the cover layer 60 with which the resistor 30 is coated and that exposes the terminal sections 41 is provided on and above the upper surface 10a of the substrate 10, as necessary, so that the strain gauge 1 is completed. For example, the cover layer 60 can be fabricated, such that a thermosetting insulating resin film in a semi-cured state is laminated on the upper surface 10a of the substrate 10, and such that the resistor 30 is coated and the terminal sections 41 are exposed; subsequently, heat is added and curing is performed. The cover layer 60 may be formed, such that a thermosetting insulating resin that is liquid or paste-like is applied to the upper surface 10a of the substrate 10, and such that the resistor 30 is coated therewith and the terminal sections 41 are exposed; subsequently, heat is added and curing is performed.

As described above, with the functional layer 20 being provided in the lower layer of the resistor 30, the crystal growth of the resistor 30 can be promoted and thus the resistor 30 having a stable crystalline phase can be fabricated. As a result, with respect to the strain gauge 1, the stability of the gauge characteristics can be improved. Also, the material that constitutes the functional layer 20 is diffused into the resistor 30, so that the gauge characteristics of the strain gauge 1 can be thereby improved.

EXAMPLE 1

First, in an advance test, Ti as the functional layer 20 was vacuum-deposited on the upper surface 10a of the substrate 10 formed of a polyimide resin that had a thickness of 25 μm, by conventional sputtering. In this case, five samples for each of which Ti was deposited were fabricated in order to target multiple film thicknesses.

Figure 4:
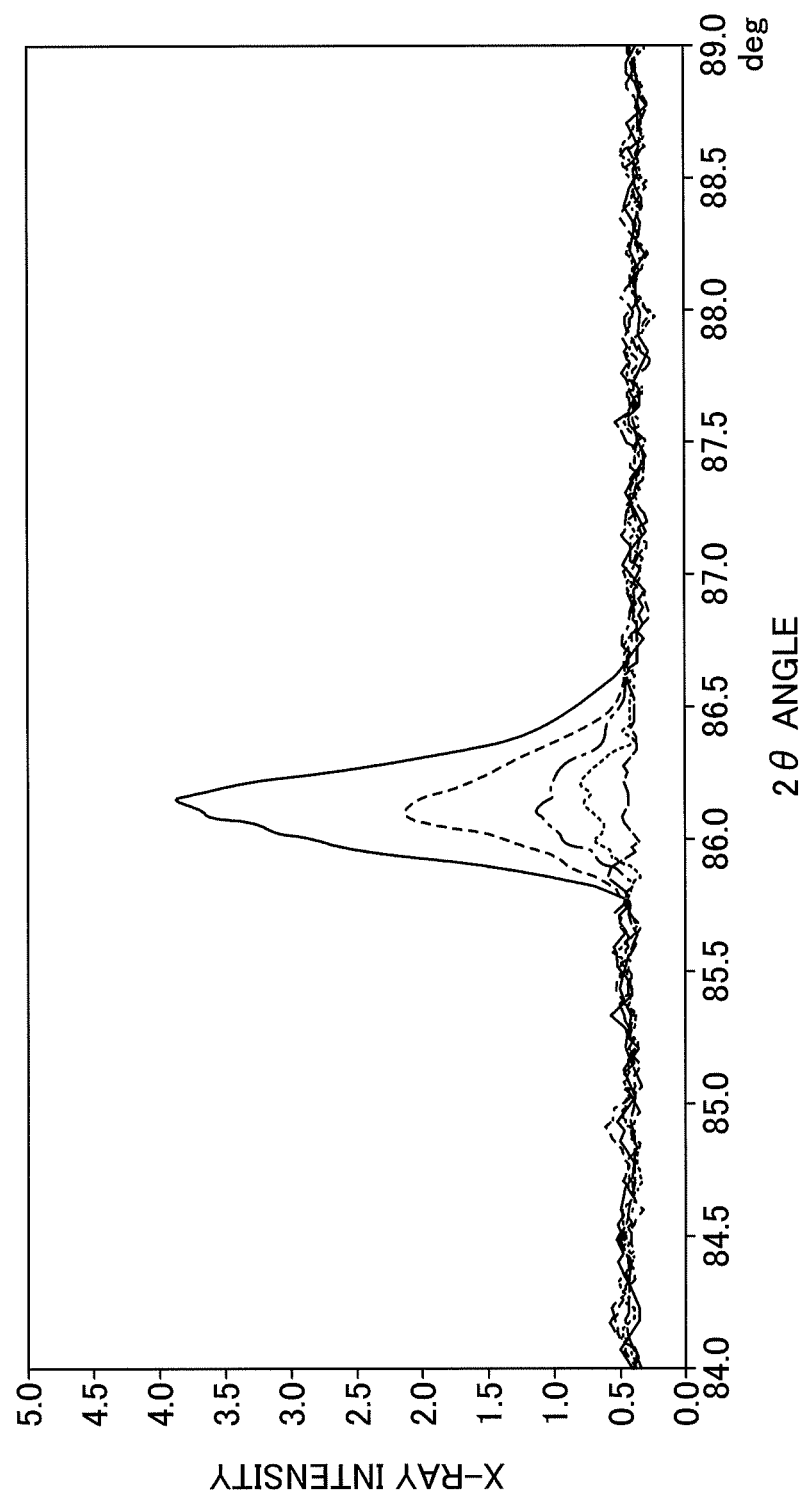
FIG. 4 is a diagram illustrating a result of X-ray fluorescent analysis for a functional layer.

Next, for the fabricated five samples, X-ray fluorescence (XRF) analysis was performed to obtain the result as illustrated in FIG. 4. From an X-ray peak in FIG. 4, it was confirmed that Ti was present, and from X-ray intensity of each sample at the X-ray peak, it was confirmed that a film thickness of a given Ti film could be controlled to be in the range of from 1 nm to 100 nm.

Next, in Example 1, Ti as the functional layer 20, which had a film thickness of 3 nm, was vacuum-deposited on the upper surface 10a of the substrate 10 formed of a polyimide resin that had a thickness of 25 μm, by conventional sputtering.

Subsequently, a Cr composite film, as the resistor 30 and the terminal sections 41, was deposited on the entire upper surface of the functional layer 20, by magnetron sputtering, and then the functional layer 20, the resistor 30, and the terminal sections 41 were patterned by photolithography, as illustrated in FIG. 1.

In comparative example 1, without forming the functional layer 20, a Cr composite film, as the resistor 30 and the terminal sections 41, was deposited on the upper surface 10a of the substrate 10 formed of a polyimide resin that had a thickness of 25 μm, by magnetron sputtering. Then, patterning was performed by photolithography, as illustrated in FIG. 1. Note that for the sample used in Example 1 and the sample used in comparative example 1, all deposition conditions for the resistor 30 and the terminal sections 41 are the same.

Figure 5:
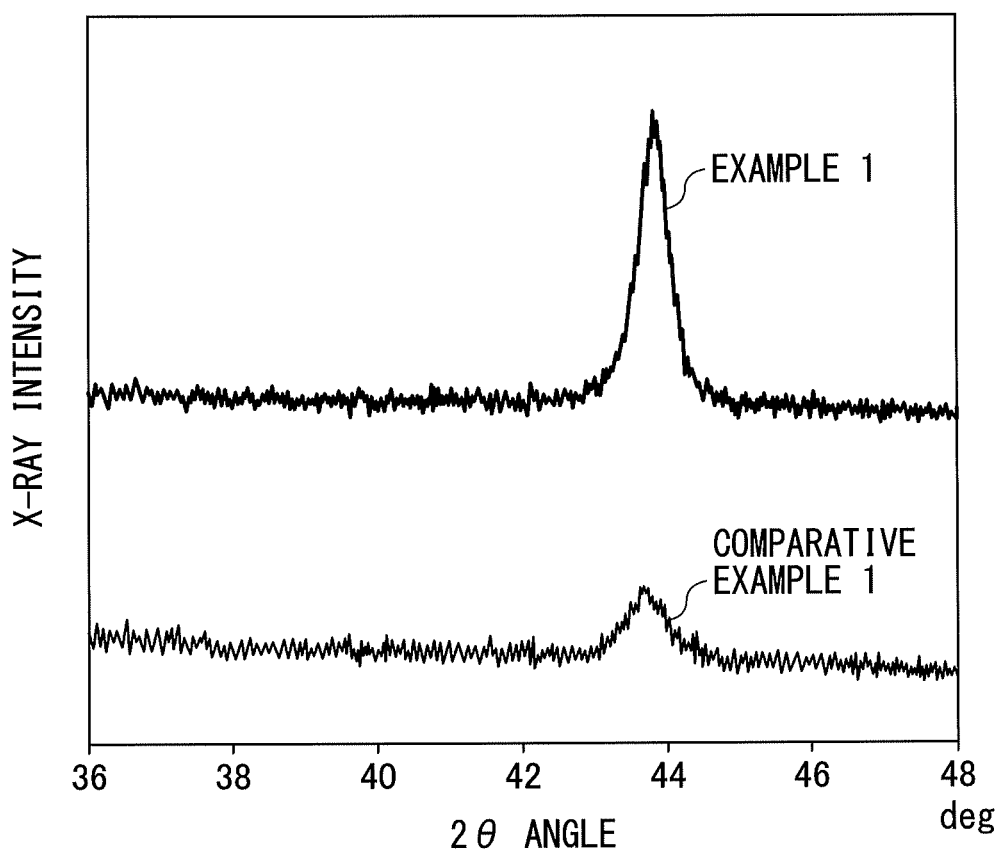
FIG. 5 is a diagram illustrating a result of X-ray diffraction for a resistor.

Next, for a given sample used in Example 1 and a given sample used in comparative example 1, X-ray diffraction evaluation was performed to obtain the result illustrated in FIG. 5. FIG. 5 illustrates an X-ray diffraction pattern at a diffraction angle of 2θ being in the range of from 36 to 48 degrees, and a diffraction peak in Example 1 is shifted to the right in comparison to a diffraction peak in comparative example 1. Further, the diffraction peak in Example 1 is greater than the diffraction peak in comparative example 1.

The diffraction peak in Example 1 is situated in proximity to a diffraction line of α-Cr (110). This is considered that when the functional layer 20 formed of Ti was provided, crystal growth of α-Cr was promoted to thereby form a Cr composite film with α-Cr as the main component.

Next, multiple samples used in Example 1 and comparative example 1 were fabricated, and gauge characteristics were measured. As a result, a gauge factor for each sample in Example 1 was between 14 and 16. In contrast, a gauge factor for each sample in comparative example 1 was less than 10.

Also, for each sample in Example 1, the gauge factor temperature coefficient TCS and temperature coefficient of resistance TCR were each in the range of from −1000 ppm/° C. to +1000 ppm/° C. In contrast, for each sample in comparative example 1, the gauge factor temperature coefficient TCS and temperature coefficient of resistance TCR were not each in the range of from −1000 ppm/° C. to +1000 ppm/° C.

As described above, with the functional layer 20 formed of Ti being provided, crystal growth of α-Cr was promoted and a Cr composite film was formed with α-Cr as the main component, so that a strain gauge that had a gauge factor of 10 or more, and that had the gauge factor temperature coefficient TCS and temperature coefficient of resistance TCR being each in the range of from −1000 ppm/° C. to +1000 ppm/° C., was fabricated. Note that the diffusion effect of Ti into the Cr composite film is considered to cause the improvement in the gauge characteristics.

The preferred embodiment and the like have been described above in detail, but are not limited thereto. Various modifications and alternatives to the above embodiment and the like can be made without departing from a scope set forth in the claims.

This International application claims priority to Japanese Patent Application No. 2017-191820, filed Sep. 29, 2017, the contents of which are incorporated herein by reference in their entirety.

REFERENCE SIGN LIST 1 strain gauge, 10 substrate, 10a upper surface, 20 functional layer, 30 resistor, 41 terminal section, 60 cover layer

The invention claimed is:

1. A strain gauge comprising:
a flexible resin substrate;
a functional layer formed of a metal, an alloy, or a metal compound, directly on one surface of the substrate; and
a resistor formed of a film that includes Cr, CrN, and $Cr_2N$ and into which an element included in the functional layer is diffused, on one surface of the functional layer,
wherein a gauge factor of the strain gauge is 10 or more, and
wherein the functional layer includes one metal compound selected from the group consisting of TiN, TaN, $Si_3N_4$, $TiO_2$, and $Ta_2O_5$.

2. A strain gauge comprising:
a flexible resin substrate;
a functional layer formed of a metal, an alloy, or a metal compound, directly on one surface of the substrate; and
a resistor formed of a film that includes Cr, CrN, and $Cr_2N$ and into which an element included in the functional layer is diffused, on one surface of the functional layer,
wherein a temperature coefficient of resistance of the strain gauge is in a range of from −1000 ppm/° C. to +1000 ppm/° C., and
wherein the functional layer includes one metal compound selected from the group consisting of TiN, TaN, $Si_3N_4$, $TiO_2$, and $Ta_2O_5$.

3. A strain gauge comprising:
a flexible resin substrate;
a functional layer formed of a metal, an alloy, or a metal compound, directly on one surface of the substrate; and
a resistor formed of a film including Cr, CrN, $Cr_2N$, on one surface of the functional layer,
wherein the functional layer includes one metal compound selected from the group consisting of TiN, TaN, $Si_3N_4$, $TiO_2$, and $Ta_2O_5$.

4. The strain gauge according to claim 1, wherein the functional layer further includes one or more metals selected from the group consisting of Cr, Ti, V, Nb, Ta, Ni, Y, Zr, Hf, Si, C, Zn, Cu, Bi, Fe, Mo, W, Ru, Rh, Re, Os, Ir, Pt, Pd, Ag, Au, Co, Mn, and Al; an alloy of any metals from among the group; or a compound of any metal from among the group.

5. The strain gauge according to claim 1, wherein the functional layer further includes one or more metals selected from the group consisting of Cr, V, Nb, Ta, Ni, Y, Hf, C, Zn, Bi, Fe, Mo, W, Ru, Rh, Re, Os, Ir, Pt, Pd, Ag, Au, Co, and Mn; an alloy of any metals from among the group; or a compound of any metal from among the group.

6. The strain gauge according to claim 1, wherein the functional layer further includes one alloy selected from the group consisting of FeCr, TiAl, FeNi, NiCr, and CrCu.

7. The strain gauge according to claim 1, wherein the functional layer protects the resistor from oxidation; suppresses movement of oxygen and moisture present in the substrate into the resistor; and/or improves adhesion between the substrate and the resistor.

8. The strain gauge according to claim 1, wherein the functional layer is patterned in a same planar shape as the resistor.

9. The strain gauge according to claim 1, wherein the functional layer has a thickness of from 1 nm to 100 nm.

10. A strain gauge comprising:
a flexible resin substrate;
a functional layer formed of a metal, an alloy, or a metal compound, directly on one surface of the substrate; and
a resistor formed of a film that includes Cr, CrN, and $Cr_2N$ and that is formed with α-Cr as a main component,
wherein the functional layer includes a function of promoting crystal growth of α-Cr and forming an α-Cr based film.

* * * * *